June 10, 1952

P. ZYLSTRA 2,600,288

FREQUENCY STABILIZING APPARATUS

Filed April 10, 1946

INVENTOR.
PAUL ZYLSTRA
BY
ATTORNEY.

Patented June 10, 1952

2,600,288

UNITED STATES PATENT OFFICE 2,600,288

FREQUENCY STABILIZING APPARATUS

Paul Zylstra, Eindhoven, Netherlands, assignor, by mesne assignments, to Hartford National Bank and Trust Company, Hartford, Conn., as trustee Application April 10, 1946, Serial No. 660,872
In the Netherlands October 14, 1943

Section 1, Public Law 690, August 8, 1946
Patent expires October 14, 1963

4 Claims. (Cl. 250—36)

This invention relates to a circuit for the generation of modulated, electric oscillations, whose carrier-wave frequency is maintained at a constant or substantially constant value by means of a control voltage which is taken from a frequency-detector to which the generated oscillations are applied.

In circuit-arrangements for the generation of modulated, electric oscillations it is generally necessary to keep the carrier-wave frequency more or less accurately constant. In a circuit-arrangement for the generation of amplitude or phase modulated oscillations, use may be made of a carrier-wave stabilized, for example, by a crystal; this is, however, impossible without additional means, if frequency-modulated oscillations are generated.

It has been suggested previously to maintain the carrier-wave frequency constant by applying the oscillations generated to a frequency-detector, deriving a control voltage from this frequency-detector and with the aid of the derived voltage readjusting the carrier-wave frequency to the desired value, for example, by means of a reactance tube. Such a control permits limiting the carrier-wave frequency deviations within certain limits.

However, the known circuit-arrangements based on this principle exhibit even considerable frequency-variations due to the influence of ambient temperature fluctuations, since not only the tuning of the carrier wave oscillator itself, but also the tuning of the frequency-detector changes due to ambient temperature fluctuations, so that in general, the divergences of the carrier wave frequency resulting from temperature variations are not suppressed by the said control comprising a frequency-detector. By the expression ambient temperature is meant the temperature immediately surrounding the component parts of the carrier wave oscillator and the frequency detector, and other references to temperature, infra, will be deemed to mean ambient temperature.

Attempts have been made to minimize these divergences by making the frequency tuning of the frequency-detector as far as possible independent of the temperature and for this purpose a thermostat has been arranged in the circuit of the frequency-detector. By means of an expensive thermostatic control it is only possible to suppress divergences from the tuning frequency of the carrier-wave oscillator that are due to temperature fluctuations to the extent that divergences due to other causes, for example, variations of the supply voltages can be suppressed.

The invention provides a method according to which variations of the carrier-wave frequency due to temperature fluctuations can be suppressed, not only in part but even completely, without the use of a thermostat. According to the invention this result is achieved by causing the tuning frequency of the frequency-detector to depend upon the temperature in such manner that the influence of temperature-fluctuations on the carrier-wave frequency is wholly or largely neutralised.

The divergence of the tuning of the frequency-detector from its correct tuning-frequency, measured in absolute value, is preferably chosen to equalize the corresponding divergence which the carrier-wave oscillator would exhibit if the said control were absent, divided by a factor (reduction factor) which indicates the measure of reaction of the frequency-detector on the tuning-frequency of the carrier-wave oscillator.

The control above described for maintaining the carrier-wave-frequency constant is achieved in practice in such manner that the oscillations generated are first mixed with oscillations received from a pilot oscillator, whose frequency is not affected to any appreciable extent by temperature fluctuations and that the oscillations of difference-frequency derived by this mixing are applied to the frequency-detector; the frequency-detector being tuned to the difference-frequency. The pilot oscillator may be constituted, for example, by a crystal-controlled oscillator or by an oscillator comprising cavity resonators.

The frequency of the pilot oscillator is preferably chosen to be higher than the carrier-wave frequency; and accordingly the aforesaid frequency divergence of the frequency-detector should have a sense similar to the said corresponding divergence of the carrier-wave oscillator.

If, in contradistinction to this premise, the frequency of the pilot oscillator is chosen to be lower than the carrier wave frequency, the aforesaid frequency divergence of the frequency-detector should have a sense opposite to the said corresponding divergence of the carrier-wave oscillator.

If the oscillations generated are applied directly to the frequency-detector, the frequency deviation of the frequency-detector must also be opposite to the said corresponding frequency deviation of the carrier-wave oscillator.

In the two latter cases the resonant circuits of the frequency-detector preferably include one or more reactances having a negative temperature coefficient.

In order that the invention may be clearly understood and readily carried into effect, it will now be explained more fully with reference to the accompanying drawing, in which.

Figure 1:
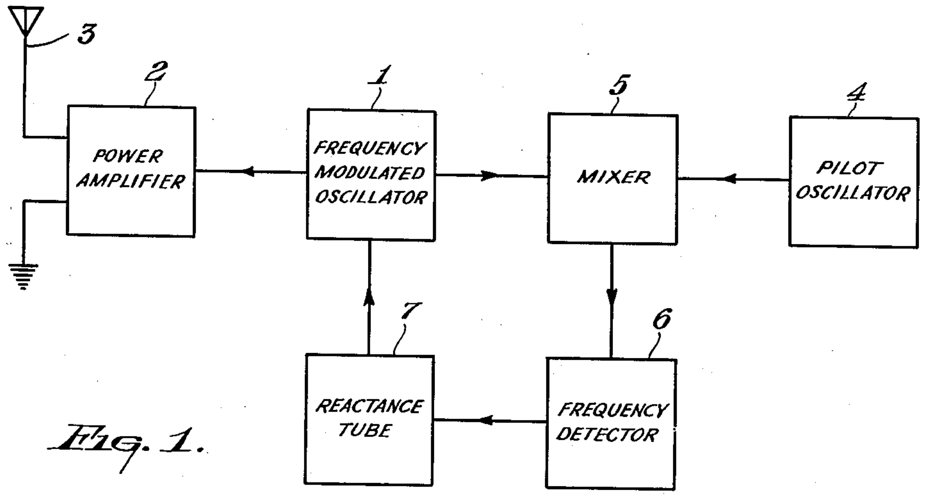
Figure 1 is a block diagram showing one embodiment of the invention.

In Fig. 1 of the drawing, 1 designates a frequency-modulated oscillator of a transmitter for ultra-short waves, i. e. a transmitter operating at 42 megacycles per second. The oscillator 1 is connected to an aerial 3 via an amplifier 2. A pilot oscillator 4 generates oscillations, for said example, at a frequency of 45 mc./s., said oscillations being applied jointly with the oscillations obtained from the oscillator 1 to a mixing stage 5. Owing to the preferable use of so called Kolster-circuits in the pilot oscillator 4, the frequency of the oscillations generated by this oscillator is very constant and substantially independent of the temperature.

The oscillations of the difference-frequency due to the mixture of the oscillations obtained from the oscillator and from the pilot oscillator respectively, are applied to a frequency-detector 6 which is tuned to the difference frequency, for said example, a frequency of 3 mc./s. If the said difference-frequency and the frequency of the frequency-detector are not identical, the frequency-detector generates a control voltage which controls a discharge tube 7 which is connected so as to exhibit the properties of a reactance varying with the mutual conductance and which influences the frequency of the oscillations generated by the oscillator 1.

If it is assumed preliminarily that the frequency of the frequency-detector and the frequency of the oscillations generated by the pilot oscillator 4 remain constant, it may be concluded that the divergence $\Delta F$ of the frequency of the oscillator 1 from its correct frequency which would occur in the absence of the control device described is reduced, owing to the presence of the control device, to the value $$\frac{\Delta F}{1+\alpha\beta}$$

where term $\alpha\beta$ indicates the measure of reaction of the frequency-detector on the frequency of the oscillator may be designated the reduction factor; $\beta$ designates the number of volts of the control voltage per kc./s. of frequency-difference between the actual frequency and the desired frequency, generated by the frequency-detector, and $\alpha$ designates the number of kc./s. by which the tuning frequency of the oscillator 1 shifts per volt of control voltage owing to the effect of the reactance tube 7. Supposing $\alpha=11$ kc./s./volt and $\beta=0.5$ volt/kc./s,, the frequency variations of the oscillator are diminished $(1+\alpha\beta)=6.5$ times.

In reality, however, the tuning of the frequency-detector does not remain constant, unless the latter is arranged in a manner in which temperature is controlled by a thermostat. A thermostatic control, however, is very expensive and is effective only to the extent that the divergences of the frequency of the oscillator due to temperature fluctuations are reduced to the same extent as the other divergences, consequently also 6.5 times.

According to the invention, the said divergences can be avoided completely without the use of a thermostatic control, not by rendering the frequency-detector operation independent of the temperature but by rendering it dependent on the temperature in the manner more fully set out hereinafter. If the divergence of the frequency-detector from its correct frequency $\Delta\varphi$, measured in absolute value, is equal to the corresponding divergence which the oscillator would exhibit if the said control were absent, divided by the aforesaid reduction factor $\alpha\beta$, consequently for $$\Delta\varphi=\frac{\Delta F}{\alpha\beta}$$

In addition, in the example given, the divergences $\Delta F$ and $\Delta\varphi$ should have the same sense and hence the same polarity. If the oscillator 1 has a temperature coefficient of $c_0$ c./s. per °C. and if the frequency generated is $f_0$, whilst the frequency-detector has a temperature coefficient of $c_d$ c./s. per °C. and a frequency $f_d$ then $c_d.f_d$ must consequently be equal to $$\frac{c_0 f_0}{\alpha\beta}$$

from which follows:

$$c_d=c_0\frac{f_0}{f_d}\cdot\frac{1}{\alpha\beta}$$

Supposing $c_0=-150.10^{-6}$ c./s. per °C., then $c_d$ becomes in the present case $$c_d=-150.10^{-6}\cdot\frac{43}{3}\cdot\frac{1}{5.5}$$

which equals about $-400.10^{-6}$ c./s. per °C. In contradistinction to this a normal frequency-detector has a temperature-coefficient of $-50.10^{-6}$ c./s. per °C., so that it is necessary to give the circuits of the detector artificially a higher negative temperature-coefficient for the frequency and this may, for example, be done by using capacitors comprising a dielectricum having a very high positive temperature coefficient.

If the frequency of the pilot oscillator 4 is chosen to be lower than the frequency of the oscillator 1, or if no pilot oscillator is used the formula for $\Delta\varphi$ becomes $$\Delta\varphi=-\frac{\Delta F}{\alpha\beta}$$

As in general an oscillator has a negative temperature coefficient for the frequency, then the frequency-detector should in either case have a positive temperature coefficient for the frequency, and this may be secured, for example, by including, in the circuits of the frequency-detector, capacitors whose dielectricum has a high negative temperature-coefficient.

At any rate it is, of course, preferable to hold the temperature-coefficient of the oscillator as low as possible and the said reduction factor as high as possible.

Figure 2:
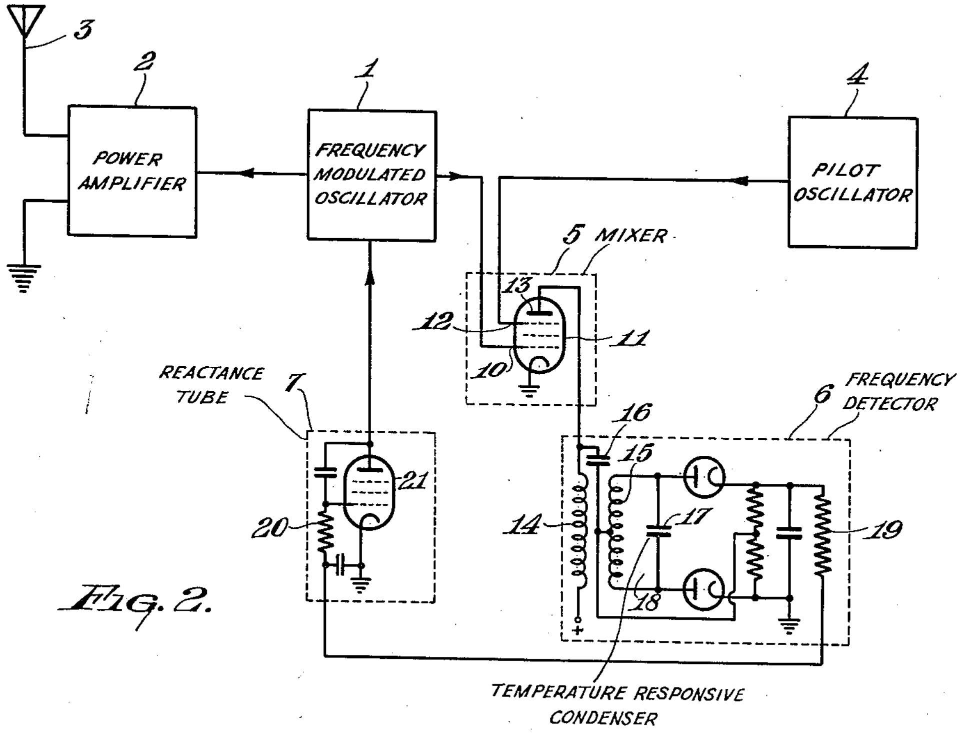
Figure 2 is a further representation of the system of Fig. 1 showing possible circuit configurations for the mixer, detector and reactance tube stages.

Figure 2 shows the embodiment of Figure 1 in greater detail. In particular, tube and circuit elements are shown for mixing stage 5, frequency-detector 6 and reactance tube 7. The output wave of oscillator 1 is applied to a control grid 10 of a mixing tube 11. The output wave of pilot oscillator 4 is applied to a grid 12 of tube 11. Anode 13 is coupled to a source of positive potential through coil 14. Coil 14 is inductively coupled to a coil 15, a D. C. blocking condenser 16 being provided between the upper end of coil 14 and a midpoint tap of coil 15. A temperature responsive condenser 17 is connected in parallel with coil 15, the parallel resonant circuit 18 formed thereby being tuned to the difference frequency output of mixer tube 11.

Temperature responsive condenser 17 is chosen to have a positive or negative temperature coefficient of the proper value to compensate the resonant frequency of circuit 18 as pointed out hereinbefore.

The remainder of frequency-detector circuit 6 is similar to the discriminator circuit disclosed in U. S. Patent 2,121,735, issued to Foster et al. on June 21, 1938.

The control voltage output of frequency-detector 6 is applied through resistors 19 and 20 to the control grid of reactance tube 21, the output voltage of which controls the frequency of F. M. oscillator 1.

The operation of the circuit arrangement of Fig. 2 corresponds exactly to that set forth in connection with Fig. 1. Assuming, as in the previous example, that oscillator 1 generates a frequency of 42 megacycles per second, while the pilot oscillator frequency is 45 megacycles per second, then the difference frequency will be 3 megacycles per second and the resonant circuit 18 will be tuned to 3 megacycles. Assuming a change in ambient temperature such that the output frequency of oscillator 1 rises by a frequency of 10 kc., then the difference frequency will be decreased by 10 kc. Due to the control action of the frequency detector 6 and the reactance tube 7, a control voltage corresponding to a frequency of 10–10/6.5 or 8.46 kc. (where 6.5 is the value of $1+\alpha\beta$) will be generated and the ultimate oscillator frequency will be 10–8.46 or 1.54 kc. above the desired frequency of 42 mc.

If, in accordance with the invention, the frequency detector 6 is made temperature responsive by means of a frequency determining, temperature responsive condenser 17, then the resonant frequency of detector 6 will be increased and the following control of the oscillator frequency is obtained if capacitor 17 embodies a dielectric with a high positive temperature coefficient. Assuming an increase in detector tuning frequency of 2 kc. corresponding to an increase of 10 kc. in oscillator 1 frequency, then the difference frequency will be increased by 10+2 or 12 kc. Due to control action of frequency detector 6 and reactance tube 7, a control voltage corresponding to a frequency of 12–12/6.5 or 10.16 kc. will be generated and the ultimate oscillator 1 frequency will be 10–10.16 or 0.16 kc. below the desired frequency of 42 mc.

It is seen that the frequency deviation of oscillator 1 is materially reduced by employing a dielectric with a high positive temperature coefficient in the frequency determining element of frequency detector 6. By proper selection of coefficient, i. e. by employing the relationship:

$$C_d = C_0\left(\frac{f_0}{f_d}\right)\left(\frac{1}{\alpha\beta}\right)$$

which was developed hereinbefore, it is possible to exactly compensate for frequency variation due to ambient temperature changes.

Where the pilot oscillator 4 frequency is lower than the frequency of oscillator 1, or where no pilot oscillator is used, it is necessary to embody a dielectric having a negative temperature coefficient in capacitor 17.

The invention can be used in circuit-arrangements for generating amplitude-modulated oscillations, as well as for circuit arrangements for generating frequency or phase modulated oscillations.

If the frequency of the pilot oscillator is not wholly independent of the temperature, this may be taken into account by slightly altering the aforesaid values of $\Delta\varphi$. If the frequency of the pilot oscillator is higher than the oscillator frequency, $\Delta\varphi$ must be increased by the divergences of the pilot oscillator; if the frequency of the pilot oscillator is lower than the oscillator frequency $\Delta\varphi$ must be reduced by the value corresponding to these divergences.

What I claim is:

1. A circuit arrangement for stabilizing the frequency of a generated carrier wave at a predetermined value independent of ambient temperature variations tending to vary the frequency of said carrier wave, comprising means to generate a carrier wave having a frequency value proportional to the ambient temperature of said generating means, means coupled to said generating means and including a frequency detector for producing a first control voltage component proportional to the frequency of said generating means, said frequency detecting means comprising a temperature responsive reactive element to produce a further control voltage component proportional to the ambient temperature of said detecting means, and means coupled to said frequency detecting means and said generating means and responsive to said control voltage components for varying the frequency of said generating means to maintain the frequency of said generated carrier wave at said predetermined frequency value independent of said ambient temperature variations.

2. A circuit arrangement for stabilizing the frequency of a generated carrier wave at a predetermined value independent of ambient temperature variations tending to vary the frequency of said carrier wave, comprising means to generate a carrier wave having a frequency value proportional to the ambient temperature variations of said carrier wave generating means, means to generate a pilot wave having a frequency value higher than the frequency value of said carrier wave, means to mix said carrier and pilot waves to produce a difference frequency wave, frequency detecting means coupled to said mixing means for producing a first control voltage component proportional to said difference frequency, said mixing means comprising a temperature responsive capacitive element having a dielectric with a positive temperature coefficient to produce a further control voltage component proportional to the ambient temperature of said frequency detecting means, and means coupled to said frequency detecting means and said carrier wave generating means and responsive to said control voltage components for varying the frequency of said carrier wave generating means to maintain the frequency of said generated carrier wave at said predetermined frequency value independent of said ambient temperature variations.

3. A circuit arrangement for stabilizing the frequency of a generated carrier wave at a predetermined value independent of ambient temperature variations tending to vary the frequency of said carrier wave, comprising means to generate a carrier wave having a frequency value proportional to the ambient temperature variations of said carrier wave generating means, means to generate a pilot wave having a frequency value lower than the frequency value of said carrier wave, means to mix said carrier and pilot waves to produce a difference frequency wave, frequency detecting means coupled to said mixing means for producing a first control voltage component proportional to said difference frequency, said mixing means comprising a temperature responsive capacitive element having a dielectric with a negative temperature coefficient to produce a further control voltage component proportional to the ambient temperature of said frequency detecting means, and means coupled to said frequency detecting means and said carrier wave generating means and responsive to said control voltage components for varying the frequency of said carrier wave generating means to maintain the frequency of said generated carrier wave at said predetermined frequency value independent of said ambient temperature variations.

4. A circuit arrangement for stabilizing the frequency of a generated carrier wave at a predetermined value independent of ambient temperature variations tending to vary the frequency of said carrier wave, comprising means to generate a carrier wave having a frequency value proportional to ambient temperature variations of said carrier wave generating means and having a first given temperature coefficient, means to generate a pilot wave having a frequency value different from the frequency value of said carrier wave, means to mix said carrier and pilot waves to produce a difference frequency wave, frequency detecting means having a second given temperature coefficient coupled to said mixing means for producing a first control voltage component proportional to said difference frequency, said detecting means comprising a temperature responsive capacitive element having a dielectric with a temperature coefficient such that:

$$C_d = C_0 \frac{f_0}{f_d}\left(\frac{1}{\alpha\beta}\right)$$

where $C_d$ represents the temperature coefficient of said detecting means, $C_0$ represents the temperature coefficient of said carrier wave generating means, $f_0$ represents said predetermined frequency value and $f_d$ represents said difference frequency, to produce a further control voltage component proportional to the ambient temperature of said detecting means, and means coupled to said detecting means and said carrier wave generating means and responsive to said control voltage components for varying the frequency of said carrier wave generating means to maintain the frequency of said generated carrier wave at said predetermined frequency value independent of said ambient temperature variations.

PAUL ZYLSTRA.

REFERENCES CITED

The following references are of record in the file of this patent:

UNITED STATES PATENTS

| Number | Name | Date |
|---|---|---|
| 1,616,622 | Horton | Feb. 8, 1927 |
| 2,055,090 | Rust | Sept. 22, 1936 |
| 2,162,883 | Foster | June 20, 1939 |
| 2,233,778 | Foster | Mar. 4, 1941 |
| 2,280,527 | Kimball | Apr. 21, 1942 |
| 2,310,797 | Lea | Feb. 9, 1943 |
| 2,406,309 | Ziegler et al. | Aug. 20, 1946 |
| 2,410,076 | Johnson | Oct. 29, 1946 |

FOREIGN PATENTS

| Number | Country | Date |
|---|---|---|
| 436,056 | Great Britain | Oct. 3, 1935 |